(12) United States Patent
Orlock et al.

(10) Patent No.: US 12,531,359 B1
(45) Date of Patent: Jan. 20, 2026

(54) RUGGEDIZED, SHIELDED, FLOATING CONNECTORS FOR PRINTED CIRCUIT BOARD ASSEMBLIES

(71) Applicant: Amazon Technologies, Inc., Seattle, WA (US)

(72) Inventors: Emily Adeline Orlock, Bellevue, WA (US); Jonathan Barak Flowers, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 497 days.

(21) Appl. No.: 18/184,875

(22) Filed: Mar. 16, 2023

(51) Int. Cl.
| | | |
|---|---|---|
| H01R 12/91 | (2011.01) | |
| H01R 13/426 | (2006.01) | |
| H01R 13/518 | (2006.01) | |
| H01R 13/66 | (2006.01) | |
| H05K 3/32 | (2006.01) | |
| H05K 1/18 | (2006.01) | |

(52) U.S. Cl.
CPC ........... *H01R 12/91* (2013.01); *H01R 13/426* (2013.01); *H01R 13/518* (2013.01); *H01R 13/665* (2013.01); *H05K 3/32* (2013.01); *H05K 1/181* (2013.01); *H05K 2201/10356* (2013.01)

(58) Field of Classification Search
CPC .... H01R 12/91; H01R 13/426; H01R 13/518; H01R 13/665; H05K 3/32; H05K 1/181; H05K 2201/10356
See application file for complete search history.

(56) References Cited

U.S. PATENT DOCUMENTS 7,862,373 B2 * 1/2011 DeMay .............. H01R 13/5202
439/587

FOREIGN PATENT DOCUMENTS

| CN | 105470715 A | * | 4/2016 | ......... H01R 13/5219 |
|---|---|---|---|---|
| CN | 105490072 B | * | 5/2018 | ......... H01R 13/5202 |
| CN | 110021850 B | * | 1/2021 | ........... H01R 13/748 |
| CN | 115668655 A | * | 1/2023 | ......... H01R 13/6315 |
| DE | 102009029545 A1 | * | 3/2011 | ......... H01R 13/6315 |

* cited by examiner

*Primary Examiner* — Travis S Chambers
(74) *Attorney, Agent, or Firm* — Athorus, PLLC

(57) ABSTRACT

Floating connectors described herein may comprise a frame, a flexible cable, and a soft mounted connector within the frame. A first portion of the frame may be configured to couple to a printed circuit board assembly, and a second portion of the frame may receive the soft mounted connector via a membrane. The flexible cable may extend between the first portion of the frame and the second portion of the frame, and may operatively couple at first and second ends with the printed circuit board assembly and the soft mounted connector, respectively. Further, the floating connectors may include a housing to provide additional electrical shielding, and/or a lock mechanism to provide positive retention between the floating connector and an external connector and/or associated housing.

20 Claims, 7 Drawing Sheets

RUGGEDIZED, SHIELDED, FLOATING CONNECTORS FOR PRINTED CIRCUIT BOARD ASSEMBLIES

BACKGROUND

Electrical connections may be made between various components and printed circuit board assemblies, e.g., associated with various machines, vehicles, devices, or systems. However, direct connections between various components and printed circuit board assemblies generally require control over tight tolerances related to such electrical connections, which may be complicated and expensive. Accordingly, there is a need for improved design of connectors to enable reliable, flexible, and cost-effective electrical connections between various components and printed circuit board assemblies.

DETAILED DESCRIPTION

As is set forth in greater detail below, implementations of the present disclosure are directed to systems and methods to manufacture, couple, and utilize ruggedized, shielded, floating connectors for printed circuit board assemblies.

In example embodiments, the example floating connectors described herein may comprise a frame, a flexible cable, and a connector that is soft mounted to a portion of the frame. For example, the frame may include a first portion that receives a first end of the flexible cable, and the frame may be rigidly or movably coupled or connected to a corresponding portion of a printed circuit board assembly. The first end of the flexible cable may be operatively connected to corresponding electrical connections of the printed circuit board assembly, and a second end of the flexible cable may be coupled to and received by the connector. The connector may be soft mounted to a second portion of the frame via a compliant or flexible membrane, and the second portion of the frame may position or orient the connector to enable electrical connection with an external or component connector, e.g., associated with a component of a machine, vehicle, device, or system.

In additional example embodiments, the example floating connectors may also include a housing that substantially encloses or surrounds the flexible cable and portions of the frame and connector. The frame may form a portion of the housing. In addition, the example floating connectors may include a locking mechanism for positive retention between the connector and a component connector. The locking mechanism may ensure secure and reliable electrical connection between a component and the printed circuit board assembly via the connector, flexible cable, and frame of the example floating connectors. Further, various elements or portions of the floating connectors may provide electrical shielding for the electrical connections enabled thereby.

Figure 1A:
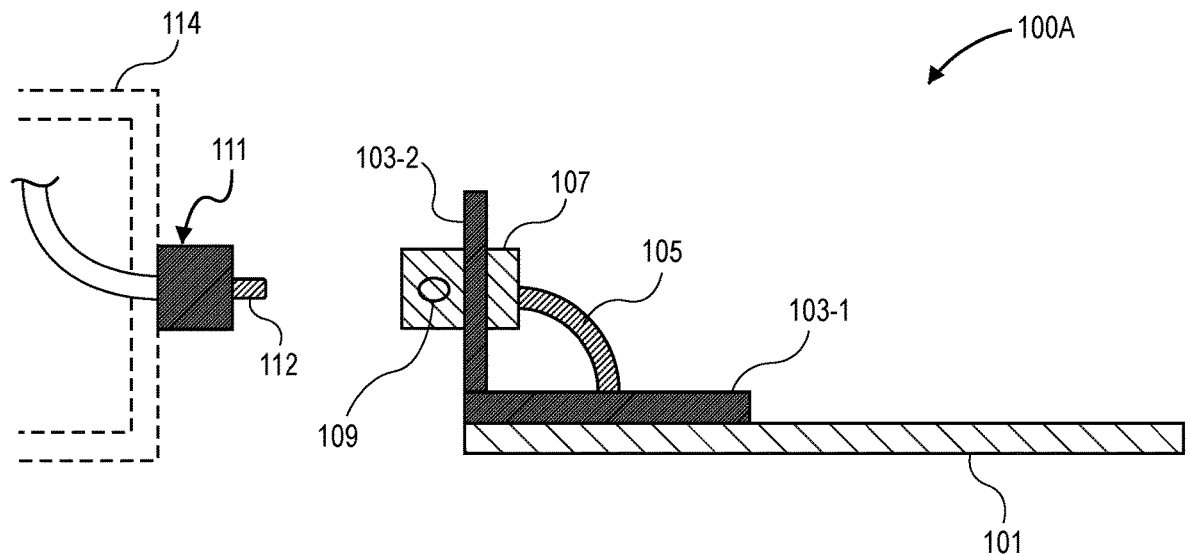
FIG. 1A is a schematic, side view diagram of an example floating connector, in accordance with implementations of the present disclosure.
Figure 1B:
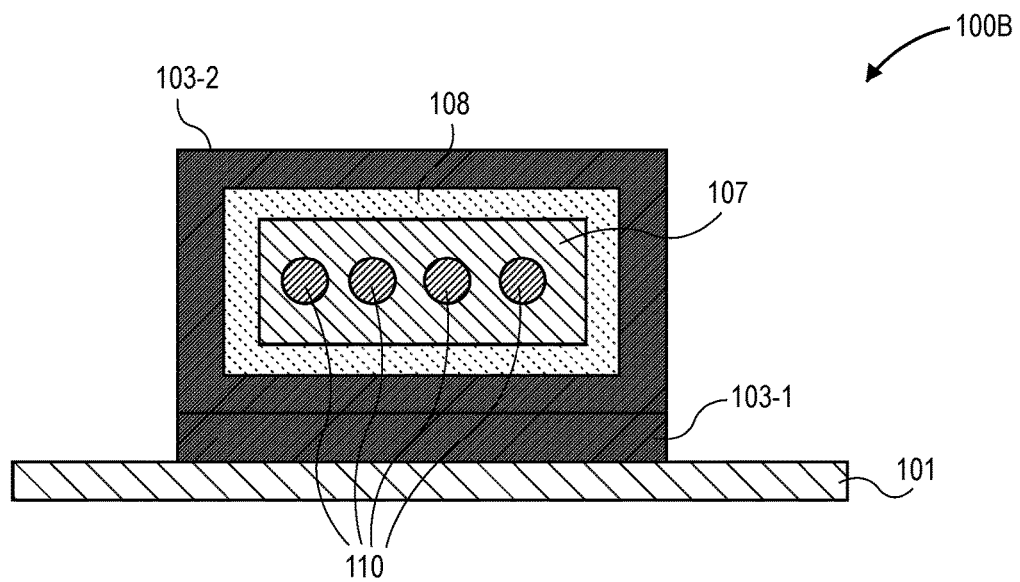
FIG. 1B is another schematic, side view diagram of an example floating connector, taken from a left side of FIG. 1A, in accordance with implementations of the present disclosure.
Figure 1C:
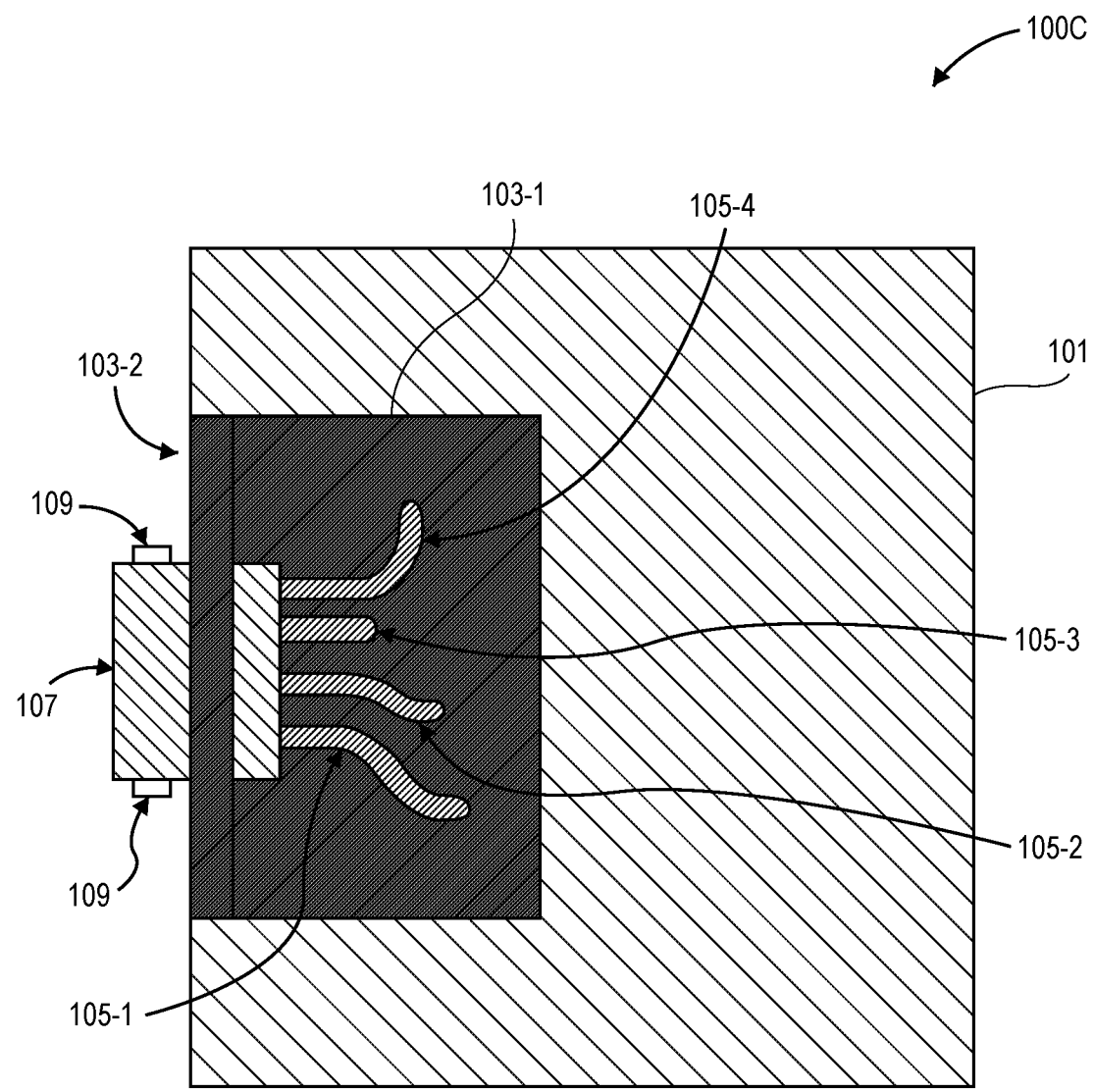
FIG. 1C is a schematic, top view diagram of an example floating connector, taken from an upper side of FIG. 1A, in accordance with implementations of the present disclosure.

FIG. 1A is a schematic, side view diagram 100A of an example floating connector, in accordance with implementations of the present disclosure, FIG. 1B is another schematic, side view diagram 100B of an example floating connector, taken from a left side of FIG. 1A, in accordance with implementations of the present disclosure, and FIG. 1C is a schematic, top view diagram of an example floating connector, taken from an upper side of FIG. 1A, in accordance with implementations of the present disclosure.

In example embodiments, the floating connector described herein may comprise a frame 103, a flexible cable 105, and a connector 107.

The frame 103 may comprise a bracket, base, bulkhead, or other structure to which the flexible cable 105 and connector 107 may be coupled. In the example of FIGS. 1A-1C, the frame 103 may be an angled or curved bracket having a first portion 103-1 and a second portion 103-2. The first and second portions 103-1, 103-2 may be angled approximately 90 degrees relative to each other. In other example embodiments, the frame 103 may have other sizes, shapes, or dimensions. In addition, the first and second portions 103-1, 103-2 may be positioned at different positions or orientations relative to each other, e.g., approximately 30 degrees, approximately 45 degrees, approximately 60 degrees, or other angles relative to each other. In further example embodiments, the frame 103 may comprise more than two portions, and may, for example, be formed in a U-shape, bowl shape, partial trapezoidal shape, or various other shapes.

The frame 103 may be configured to couple or connect with a printed circuit board assembly 101 or a housing that substantially encloses or surrounds the printed circuit board assembly 101. For example, a first portion 103-1 of the frame may be substantially rigidly or fixedly coupled to the printed circuit board assembly 101, e.g., via adhesives, heat-staking, fasteners, or other methods. In other examples, the first portion 103-1 of the frame may be movably or flexibly coupled to the printed circuit board assembly 101, e.g., via flexible, resilient, or compliant connections. In further examples, the first portion 103-1 of the frame may be rigidly coupled to either of the printed circuit board assembly 101 or the housing that substantially encloses or surrounds the printed circuit board assembly 101. In addition, the frame 103 may be electrically grounded with respect to the printed circuit board assembly 101.

The frame 103 may be formed of various materials, such as plastics, composites, metals, and/or other materials. In some examples, the frame 103 may be formed of conductive plastics, metals, or other conductive materials, in order to provide electrical shielding to the flexible cable 105 and/or connector 107.

The flexible cable 105 may be coupled to and received by a portion of the frame 103. For example, the flexible cable 105 may comprise one or more braided contacts, one or more stranded contacts, and/or a flexible printed circuit board (PCB). A first end of the flexible cable 105 may be received by a portion of the frame 103. In addition, one or more contact pins, strands, wires, or contacts of a first end of the flexible cable 105 may be operatively coupled to corresponding contact pins, holes, or contacts associated with a surface of the printed circuit board assembly 101, e.g., via soldering, press-fit, or other electrical connection methods. In this manner, the first end of the flexible cable 105, e.g., individual braids, strands, or wires thereof, may be operatively and/or electrically connected to respective contact pins, holes, or contacts of the printed circuit board assembly 101.

In addition, a second end of the flexible cable 105 may be operatively and/or electrically coupled to the connector 107. For example, the second end of the flexible cable 105, e.g., individual braids, strands, or wires thereof, may be operatively connected to respective contact pins or holes 110 of the connector 107, as shown in FIG. 1B. In other example embodiments, various other types, numbers, sizes, or shapes of contact pins or holes 110 may be included within the connector 107, as compared to the example of FIG. 1B.

Furthermore, as shown in FIG. 1C, a plurality of flexible cables 105-1, 105-2, 105-3, 105-4 may be coupled and associated with the frame 103 and the connector 107. In example embodiments, each of the plurality of flexible cables 105-1, 105-2, 105-3, 105-4 may be physically separated or divided from each other, e.g., via physical dividers or electrical insulation, in order to prevent electrical interference, electrical arcing, or other undesirable effects. In some examples, an individual flexible cable 105 may be associated with and electrically connected to a single contact pin or hole of the connector 107. In other examples, an individual flexible cable 105 may include multiple braids, strands, or wires that may be associated with and electrically connected to respective contact pins or holes of the connector 107. Various other types, numbers, sizes, or shapes of flexible cables 105 may be coupled and associated with the frame 103 and the connector 107.

The flexible cable 105 may be formed of various materials, such as plastics, composites, metals, and/or other materials, as well as various metals or other conductive materials for the braids, strands, and/or wires having appropriate electrical insulation as desired. In some examples, the flexible cable 105 may be formed of conductive plastics, metals, or other conductive materials with appropriate electrical insulation relative to the inner braids, strands, and/or wires, in order to provide electrical shielding to inner conductive braids, strands, and/or wires of the flexible cable 105.

The connector 107 may comprise one or more contact pins or holes 110, and the contact pins or holes 110 may be configured to couple or connect with corresponding contact pins or holes 112 of an external or component connector 111 and/or associated housing 114. Although the connector 107 is shown in FIG. 1B as substantially rectangular, in other example embodiments, the connector 107 may have various other sizes, shapes, or dimensions.

The connector 107 may be movably coupled to the frame 103, e.g., the second portion 103-2 of the frame, via a membrane 108. For example, the connector 107 may be soft mounted via the membrane 108 within an opening or orifice of the second portion 103-2 of the frame. Due to the movable coupling or soft mounting, the connector 107 may be compliant, flexible, and/or movable within certain limits. For example, the connector 107 may be movable or translatable up to and/or approximately 5 mm, approximately 8 mm, approximately 10 mm, or other amounts in one or more directions, e.g., all directions. Further, the connector 107 may be rotatable up to and/or approximately 10 degrees, approximately 15 degrees, approximately 30 degrees, or other amounts in one or more rotational directions, e.g., all rotational directions.

The connector 107 may be formed of various materials, such as plastics, composites, metals, and/or other materials. In some examples, the connector 107 may be formed of conductive plastics, metals, or other conductive materials having appropriate electrical insulation for the contact pins or holes 110, in order to provide electrical shielding to the contact pins or holes 110 of the connector 107.

In additional example embodiments, the connector 107 may further include a lock mechanism 109 or a portion thereof. For example, the lock mechanism 109 may provide positive retention between the connector 107 and an external or component connector 111 and/or associated housing 114. Various example lock mechanisms 109 are further described herein at least with respect to FIGS. 4A-4D.

The membrane 108 may substantially surround or enclose a periphery of the connector 107, such that the membrane 108 extends between the connector 107 and the second portion 103-2 of the frame. As a result, at least a portion of the membrane 108 may be positioned between any and all portions of the connector 107 and the frame 103. Further, portions of the membrane 108 may have various dimensions and/or thicknesses.

The membrane 108 may comprise various materials, such as silicone, rubber, conductive fabric, and/or other compliant, resilient, or flexible materials. In some examples, the membrane 108 may be formed of silicone or rubber, and a conductive fabric or other conductive materials may be applied to the silicone or rubber, in order to provide electrical shielding to the connector 107.

Various material properties and/or dimensional characteristics of the membrane 108 may affect the compliance or flexibility characteristics of the connector 107 relative to the frame 103. For example, dependent upon the material properties and/or dimensional characteristics of the membrane 108, the connector 107 may have different amounts of translational movement and/or rotational movement in one or more directions during connection or disconnection between the connector 107 and a component connector 111 and/or associated housing 114.

In example embodiments in which the connector 107 is configured to couple to an external connector 111 having an associated external housing 114, the compliance or flexibility characteristics of the connector 107 due to the material properties and/or dimensional characteristics of the membrane 108 may enable secure and reliable electrical connections between the connector 107 and external connector 111, even in the presence of dimensional variations, tolerance stack-ups, or other variations due to design, manufacturing, or other processes. Such dimensional variations, tolerance stack-ups, or other variations may prevent direct connections between the printed circuit board assembly 101 and the external connector 111 and/or associated housing 114. However, the example floating connectors described herein may enable secure and reliable electrical connections by compensating for dimensional variations, tolerance stack-ups, or other variations.

Although FIGS. 1A-1C illustrate a particular type, number, configuration, or arrangement of various elements or portions of the floating connector, other example embodiments may include other types, numbers, configurations, or arrangements of the various elements or portions of the floating connector. For example, the frame may have various other sizes, shapes, or dimensions, the flexible cable may have various other types, sizes, shapes, or dimensions, the connector may have various other sizes, shapes, or dimensions, the membrane may have various types, materials, or dimensions, and/or various other modifications may be made in other example embodiments. Further, a single floating connector may include one or more frame portions, one or more flexible cables, one or more connectors, and/or one or more membranes.

In further example embodiments, the elements or portions of the floating connector formed of various plastics may include polyetherimide (PEI), acrylonitrile butadiene styrene (ABS), polycarbonate, liquid crystal polymer (LCP), and/or other types of plastics. In addition, the elements or portions of the floating connector formed of various metals may include aluminum, magnesium, titanium, steel, beryllium-copper alloys, and/or other types of metals. Further, the contact pins or holes of connectors may be formed of various metals, such as steel, nickel, beryllium-copper alloys, and/or other types of metals, and may include gold plating or other types of plating.

Figure 2:
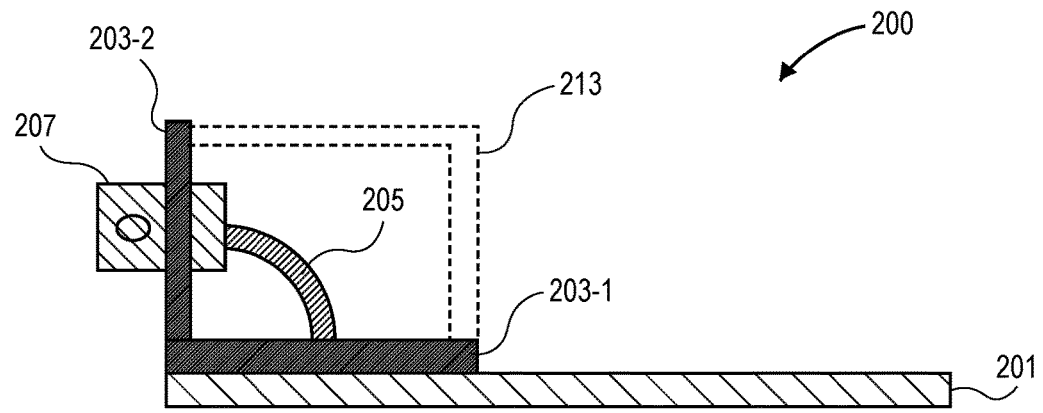
FIG. 2 is a schematic, side view diagram of another example floating connector, in accordance with implementations of the present disclosure.

FIG. 2 is a schematic, side view diagram 200 of another example floating connector, in accordance with implementations of the present disclosure.

In example embodiments, the floating connector described herein may comprise a frame 203, a flexible cable 205, and a connector 207, and may be configured to couple to a printed circuit board assembly 201. The floating connector of FIG. 2 may include any and all of the features described herein at least with respect to FIGS. 1A-1C. As further described herein, the frame 203 may comprise one or more portions 203-1, 203-2.

As shown in FIG. 2, the floating connector may also include a housing 213 that substantially surrounds or encloses portions of the floating connector. For example, the housing 213 may substantially surround or enclose the flexible cable 205, as well as portions of the frame 203 and/or the connector 207. In some examples, the frame 203, including one or more portions 203-1, 203-2 thereof, may form a part of the housing 213, e.g., a base or other portion of the housing 213. As shown in the example of FIG. 2, the housing 213 may comprise a substantially rectangular prism or box shape. In additional example embodiments, the housing 213 may substantially enclose or surround the printed circuit board assembly 201.

The housing 213 may be formed of various materials, such as plastics, composites, metals, or other materials. In some examples, the housing 213 may be formed of conductive plastics, metals, or other conductive materials, in order to provide electrical shielding to the flexible cable 205, as well as portions of the frame 203 and/or the connector 207, that are substantially surrounded or enclosed by the housing 213.

Although FIG. 2 illustrates a particular type, configuration, or arrangement of various elements or portions of an example housing of the floating connector, other example embodiments may include other types, sizes, shapes, dimensions, configurations, or arrangements of the various elements or portions of the example housing of the floating connector.

Figure 3:
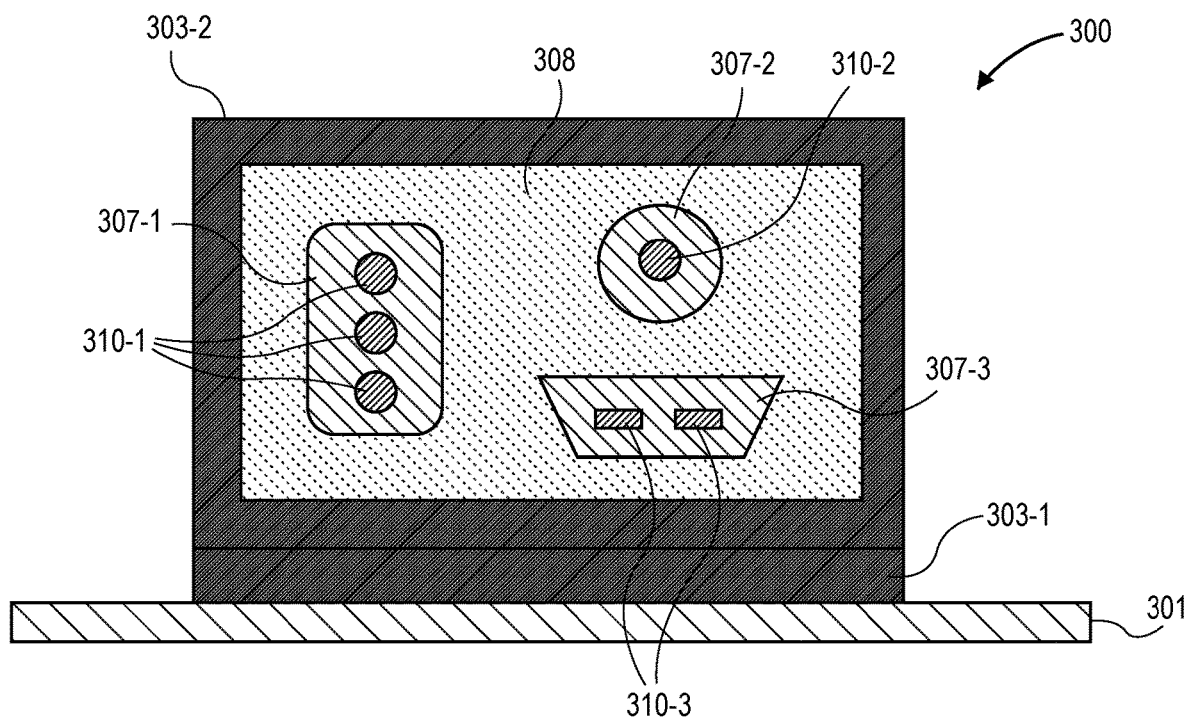
FIG. 3 is another schematic, side view diagram of another example floating connector, taken from a left side of FIG. 1A or 2, in accordance with implementations of the present disclosure.

FIG. 3 is another schematic, side view diagram 300 of another example floating connector, taken from a left side of FIG. 1A or 2, in accordance with implementations of the present disclosure.

In example embodiments, the floating connector described herein may comprise a frame 303, a flexible cable (not shown), and one or more connectors 307, and may be configured to couple to a printed circuit board assembly 301. The floating connector of FIG. 3 may include any and all of the features described herein at least with respect to FIGS. 1A-1C, and 2. The example illustration of FIG. 3 is similar to that shown in FIG. 1B.

As shown in FIG. 3, the frame 303 may include one or more portions 303-1, 303-2. In addition, the one or more connectors 307 may include a first connector 307-1, a second connector 307-2, and a third connector 307-3, which may be associated with one or more flexible cables (not shown). Each of the first, second, and third connectors 307-1, 307-2, 307-3 may be movably coupled to the second portion 303-2 of the frame via a membrane 308. The membrane 308 may be formed of various compliant, resilient, and/or flexible materials, in order to provide compliance or flexibility to the connectors 307 during connection or disconnection with one or more external or component connectors.

In addition, each of the connectors 307-1, 307-2, 307-3 may have various different sizes, shapes or dimensions. The connectors 307-1, 307-2, 307-3 may also include contact pins or holes 310-1, 310-2, 310-3, respectively, which may also have various different types, numbers, sizes, shapes, or dimensions. In the example shown in FIG. 3, the first connector 307-1 may be substantially rectangular in shape, and may include three substantially circular or cylindrical contact pins or holes 310-1. The second connector 307-2 may be substantially circular or cylindrical in shape, and may include one substantially circular or cylindrical contact pin or hole 310-2. The third connector 307-3 may be substantially trapezoidal in shape, and may include two substantially flat or rectilinear contact pins or holes 310-3.

Although FIG. 3 illustrates a particular type, configuration, or arrangement of various elements or portions of one or more connectors of the floating connector, other example embodiments may include other types, numbers, sizes, shapes, dimensions, configurations, or arrangements of the various elements or portions of one or more connectors of the floating connector. For example, one or more connectors may be movably coupled to portions of a frame, the one or more connectors may have various sizes, shapes, or dimensions, and/or the one or more connectors may have various types, numbers, sizes, shapes, or dimensions of contact pins or holes to operatively couple with corresponding external or component connectors.

FIGS. 4A-4D are schematic diagrams 400A, 400B, 400C, 400D of example positive retention mechanisms for an example floating connector, in accordance with implementations of the present disclosure.

As schematically illustrated in FIGS. 1A-1C, 2, and 3, the connectors 107, 207, 307 may include one or more lock mechanisms 109, and external or component connectors 111 and/or associated housings 114 may also include corresponding portions of the lock mechanism 109. In example embodiments, the lock mechanisms 109 may comprise cam locks, sliding cam locks, slam locks or latches, sash locks, draw latches, slide locks, bayonet connections, threaded connections, and/or other types of locking clips, clamps, or latches.

Figure 4A:
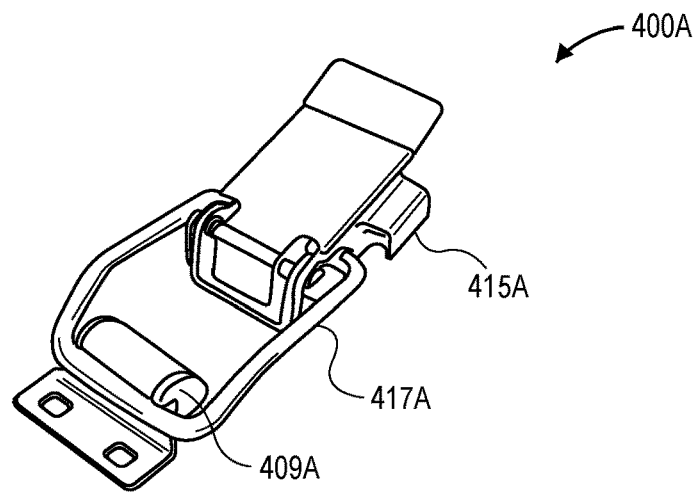
FIGS. 4A-4D are schematic diagrams of example positive retention mechanisms for an example floating connector, in accordance with implementations of the present disclosure.

In one example embodiment shown in FIG. 4A, the connectors 107, 207, 307 may include portions of a lock mechanism that is similar to slam locks or latches, draw latches, or similar types of lock mechanisms. The example lock mechanism may include a hook or catch 409A, a lever or handle 415A, and a loop or ring 417A. In order to secure the lock mechanism, the lever 415A may be raised or lifted and the loop 417A may be extended over and around the hook 409A, and then the lever 415A may be lowered or depressed to secure the loop 417A in the hook 409A. In order to release the lock mechanism, the process may be substantially reversed. Generally, one portion of the lock mechanism, e.g., hook 409A, may be coupled to one of the connector 107, 207, 307 or component connector 111, and the other portion of the lock mechanism, e.g., lever 415A and loop 417A, may be coupled to the other of the connector 107, 207, 307 or component connector 111.

Figure 4B:
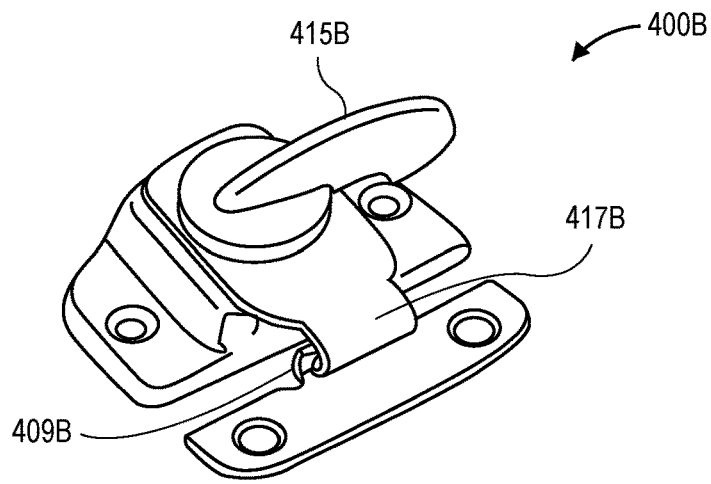

In another example embodiment shown in FIG. 4B, the connectors 107, 207, 307 may include portions of a lock mechanism that is similar to cam locks, sliding cam locks, sash locks, or similar types of lock mechanisms. The example lock mechanism may include a hook or catch 409B, a lever or handle 415B, and a locking hook 417B. In order to secure the lock mechanism, the locking hook 417B may be positioned to extend over the hook 409B, and the lever 415B may be rotated to retract and secure the locking hook 417B with the hook 409B. In order to release the lock mechanism, the process may be substantially reversed. Generally, one portion of the lock mechanism, e.g., hook 409B, may be coupled to one of the connector 107, 207, 307 or component connector 111, and the other portion of the lock mechanism, e.g., lever 415B and locking hook 417B, may be coupled to the other of the connector 107, 207, 307 or component connector 111.

Figure 4C:
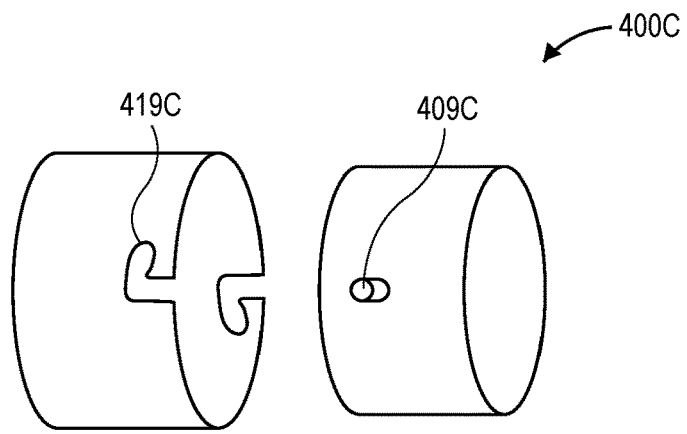

In a further example embodiment shown in FIG. 4C, the connectors 107, 207, 307 may include portions of a lock mechanism that is similar to bayonet connections or similar types of lock mechanisms. The example lock mechanism may include a locking pin 409C and a locking groove 419C. In order to secure the lock mechanism, the locking pin 409C may be inserted into the locking groove 419C, and the locking pin 409C and locking groove 419C may be rotated relative to each other to secure the locking pin 409C within a portion of the locking groove 419C. In order to release the lock mechanism, the process may be substantially reversed. Generally, one portion of the lock mechanism, e.g., pin 409C, may be coupled to one of the connector 107, 207, 307 or component connector 111, and the other portion of the lock mechanism, e.g., groove 419C, may be coupled to the other of the connector 107, 207, 307 or component connector 111.

Figure 4D:
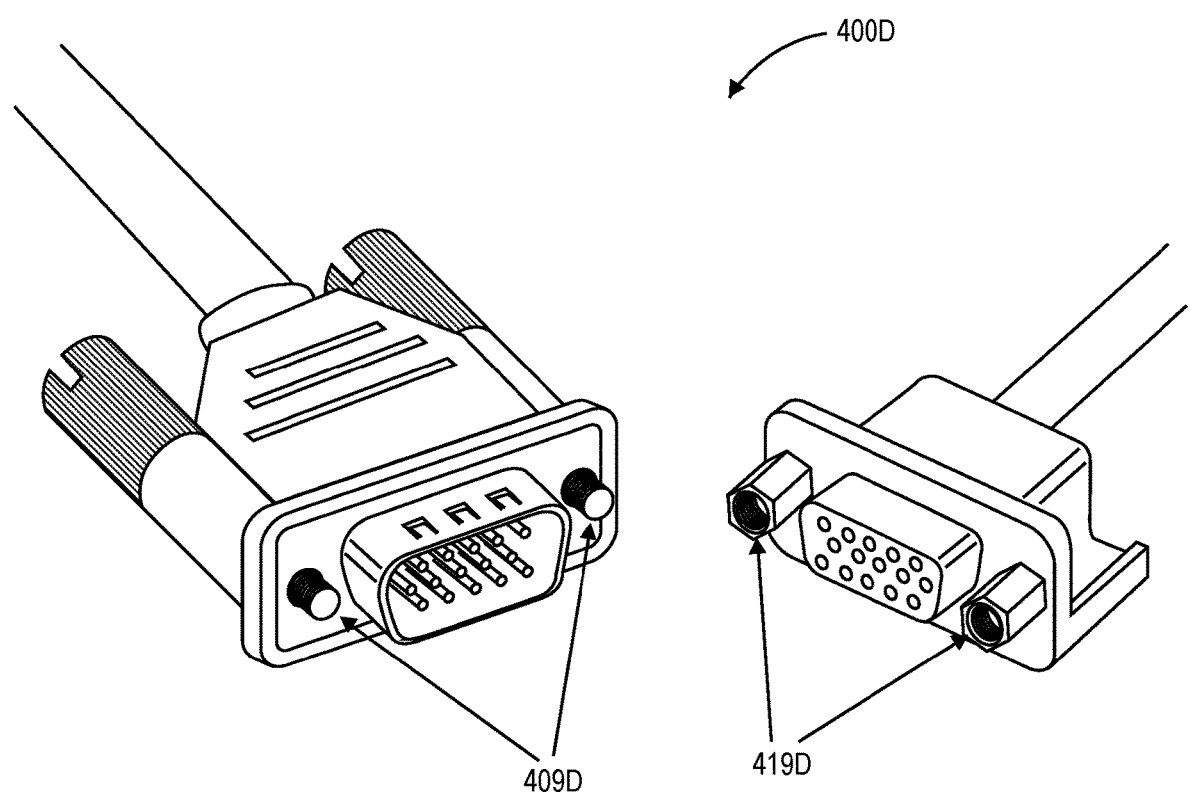

In yet another example embodiment shown in FIG. 4D, the connectors 107, 207, 307 may include portions of a lock mechanism that is similar to D-subminiature (D-sub) connectors, video graphics array (VGA) connectors, or other similar connectors. The example lock mechanism may include one or more locking screws 409D and one or more corresponding locking nuts 419D. In order to secure the lock mechanism, the locking screws 409D may be inserted and threaded into the locking nuts 419D. In order to release the lock mechanism, the process may be substantially reversed. Generally, one portion of the lock mechanism, e.g., locking screw 409D, may be coupled to one of the connector 107, 207, 307 or component connector 111, and the other portion of the lock mechanism, e.g., locking nut 419D, may be coupled to the other of the connector 107, 207, 307 or component connector 111.

Various other types of lock mechanisms may be included or formed as part of the connectors described herein in order to provide positive retention between the connectors and various external or component connectors. Further, the lock mechanisms may secure and release the connectors with respect to various external or component connectors without transferring excessive force or stress to the connectors, membranes, flexible cables, and/or frames of the floating connectors described herein during connection or disconnection.

By the various features of example floating connectors described herein, the floating connectors may enable substantial float, compliance, or flexibility for electrical connections, may be ruggedized, may be shielded, and/or may provide positive retention of such electrical connections. For example, the example floating connectors may allow displacement, movement, and/or rotation in one or more, e.g., all, translational and/or rotational directions via the compliant, resilient, and/or flexible membranes and flexible cables. In addition, the example floating connectors may be substantially waterproof, weatherproof, and/or resistant to shock and vibration. Further, the example floating connectors may provide electrical shielding to the electrical connections between external or component connectors and the printed circuit board assembly. Moreover, the example floating connectors may ensure secure and reliable connection and disconnection with positive retention, while also reducing forces necessary for connection and disconnection.

In various example embodiments, the example floating connectors may be utilized for various types of electrical connections, including data connections, power connections, hybrid or combined connections, and/or other types of connections associated with components or portions of various machines, vehicles, devices, or systems. In particular example embodiments in which maintaining control over tight tolerances of such electrical connections may be difficult or challenging, the example floating connectors described herein may facilitate secure, reliable, flexible, and cost-effective electrical connections, as compared to conventional external harnessing that may be more complex, less adaptable, less compliant or flexible, and more expensive.

Figure 5:
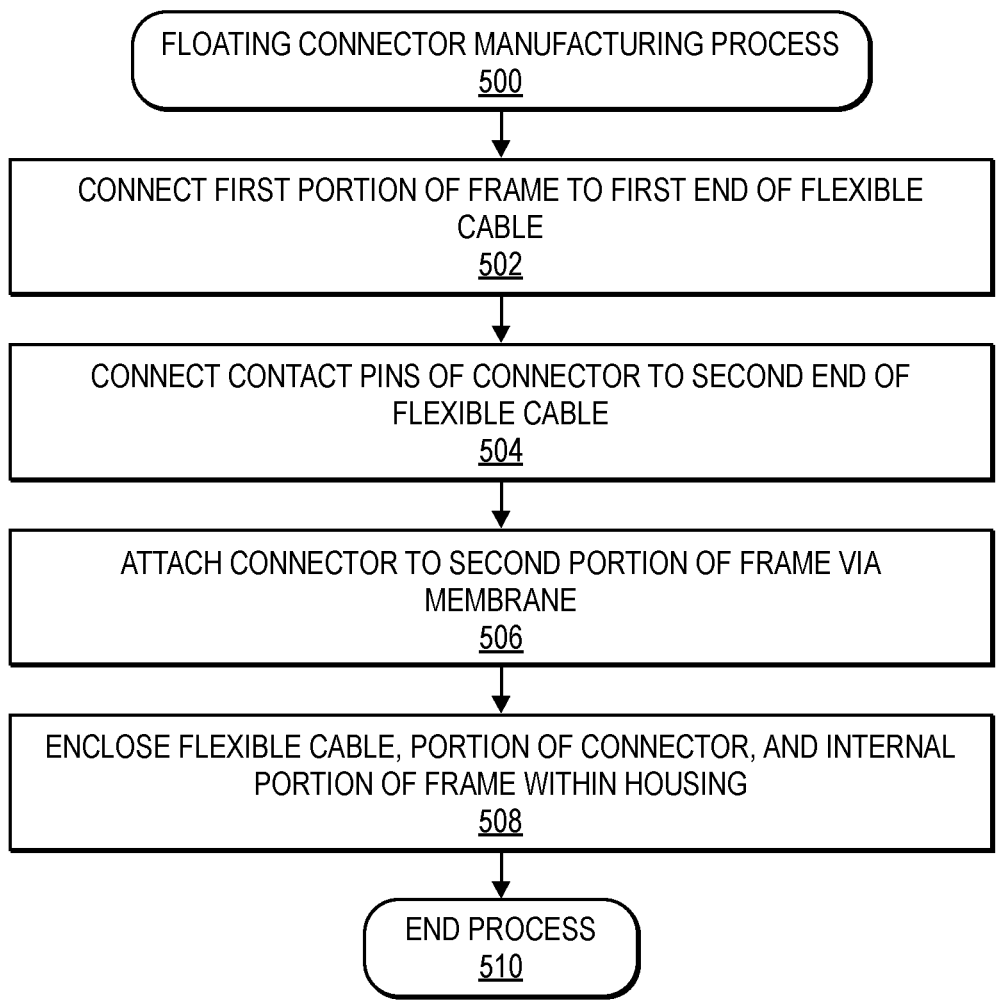
FIG. 5 is a flow diagram illustrating an example floating connector manufacturing process, in accordance with implementations of the present disclosure.

FIG. 5 is a flow diagram illustrating an example floating connector manufacturing process 500, in accordance with implementations of the present disclosure.

The process 500 may begin by connecting a first portion of a frame to a first end of a flexible cable, as at 502. For example, the first portion of the frame may be configured to rigidly or flexibly couple with a printed circuit board assembly, and the first portion of the frame may receive a first end of the flexible cable. The first end of the flexible cable may comprise one or more braids, strands, and/or wires that are configured to couple to respective contact pins, holes, or contacts of the printed circuit board assembly, in order to create appropriate electrical connections with portions of the printed circuit board assembly. As a result, the various braids, strands, and/or wires of the first end of the flexible cable may be coupled or received by the first portion of the frame to facilitate electrical connection with portions of the printed circuit board assembly. Further, a control system may command or instruct connecting the first portion of the frame to the first end of the flexible cable.

The process 500 may continue by connecting contact pins of a connector to a second end of the flexible cable, as at 504. For example, the connector may be configured to couple with an external or component connector and/or associated housing, and the connector may include one or more contact pins or holes to facilitate electrical connections with the component connector and/or associated housing. The second end of the flexible cable may comprise one or more braids, strands, and/or wires that are configured to couple to respective contact pins or holes of the connector, in order to create appropriate electrical connections with portions of the connector and external connector. As a result, the various braids, strands, and/or wires of the second end of the flexible cable may be coupled or connected to corresponding contact pins or holes of the connector. Further, a control system may command or instruct connecting contact pins of the connector to the second end of the flexible cable.

The process 500 may proceed by attaching the connector to a second portion of the frame via a membrane, as at 506. For example, the second portion of the frame may be positioned or oriented in order to facilitate electrical connections between the connector and an external or component connector and/or associated housing. The second portion of the frame may include an orifice or opening within which the connector may be attached via a membrane, and the membrane may comprise silicone, rubber, or other compliant, resilient, or flexible materials. As a result, the connector may be movably, compliantly, and/or flexibly coupled, e.g., soft mounted, within the second portion of the frame via the membrane. Further, a control system may command or instruct attaching the connector to the second portion of the frame via the membrane.

The process 500 may then continue to enclose the flexible cable, a portion of the connector, and an internal portion of the frame within a housing, as at 508. For example, in some example embodiments, a housing may be formed as part of the floating connector that substantially encloses or surrounds the flexible cable and portions of the frame and the connector. The housing, as well as various other portions or elements of the floating connector, may provide electrical shielding to the electrical connections facilitated by the floating connector. Further, a control system may command or instruct enclosing the flexible cable, the portion of the connector, and the internal portion of the frame within the housing.

The process 500 may then end, as at 510.

Figure 6:
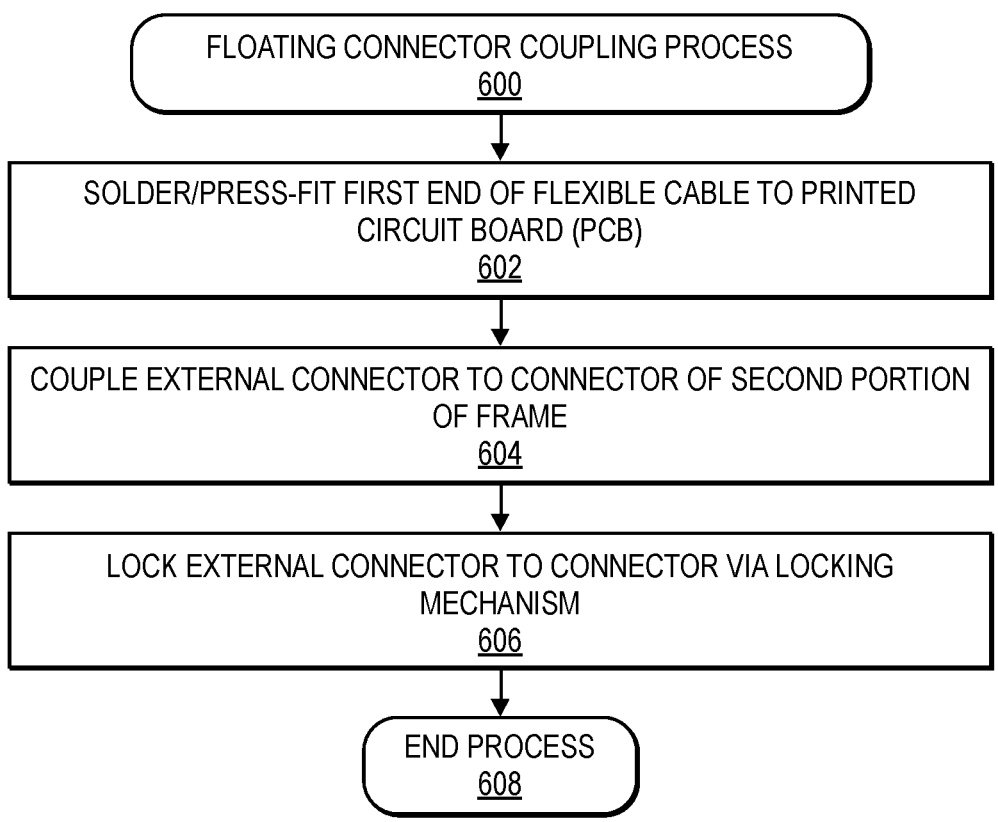
FIG. 6 is a flow diagram illustrating an example floating connector coupling process, in accordance with implementations of the present disclosure.

FIG. 6 is a flow diagram illustrating an example floating connector coupling process 600, in accordance with implementations of the present disclosure.

The process 600 may begin by soldering and/or press-fitting contact pins of a first end of a flexible cable to a printed circuit board (PCB), as at 602. For example, the PCB may comprise a printed circuit board assembly (PCBA), and may include various pins, holes, or contacts for various electrical connections. Various contacts, pins, holes, strands, or wires associated with the first end of the flexible cable may be coupled or connected with corresponding pins, holes, or contacts of the printed circuit board assembly, and such connections may be soldered, press-fit, or otherwise joined. In this manner, the first end of the flexible cable may be operatively coupled to the printed circuit board assembly with associated electrical connections therebetween.

The process 600 may continue by coupling an external connector to the connector of the second portion of the frame, as at 604. For example, the connector may include various contact pins or holes, and may be soft mounted within the second portion of the frame. The external or component connector and/or associated housing may also include various contact pins or holes that are configured to couple or connect with the contact pins or holes of the connector. Thus, the connector may be coupled, connected, or mated with the external connector and/or associated housing by coupling contact pins or holes of the respective connectors. Further, the soft mounting of the connector within the second portion of the frame may provide compliance, resilience, and/or flexibility during connection or disconnection of the connector and the external connector and/or associated housing.

The process 600 may proceed by locking the external connector to the connector via a locking mechanism, as at 606. For example, various types of lock mechanisms may be associated with the connector and external connector and/or associated housing, in order to enable secure and reliable connection and disconnection with positive retention. In addition, a first portion of a lock mechanism may be associated with the connector, and a second portion of a lock mechanism may be associated with the external connector and/or associated housing. In this manner, the connector and external connector may be securely connected with positive retention, to enable more reliable coupling and reduced connection forces or stresses.

The process 600 may then end, as at 608.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, including but not limited to the flow charts shown in FIGS. 5 and 6, orders in which such methods or processes are presented are not intended to be construed as any limitation on the claimed inventions, and any number of the method or process steps or boxes described herein can be omitted, reordered, or combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

The elements of a method, process, or algorithm described in connection with the implementations disclosed herein can be embodied directly in hardware, in a software module stored in one or more memory devices and executed by one or more processors, or in a combination of the two. A software module can reside in RAM, flash memory, ROM, EPROM, EEPROM, registers, a hard disk, a removable disk, a CD ROM, a DVD-ROM or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A floating connector, comprising:
 a frame, a first portion of the frame configured to couple to a printed circuit board assembly;
 a flexible cable, a first end of the flexible cable received by the first portion of the frame and configured to operatively couple to the printed circuit board assembly;
 a connector coupled to a second end of the flexible cable, the connector being coupled to a second portion of the frame via a compliant membrane; and
 a lock mechanism configured to positively retain the connector and an external connector.

2. The floating connector of claim 1, wherein the flexible cable comprises at least one of a braided contact, a stranded contact, or a flexible printed circuit board (PCB).

3. The floating connector of claim 1, wherein the compliant membrane comprises at least one of silicone, rubber, or conductive fabric.

4. The floating connector of claim 1, wherein the lock mechanism comprises at least one of a locking clamp, a draw latch, a cam lock, a slam lock, a sash lock, a slide lock, a bayonet connection, or a threaded connection.

5. The floating connector of claim 1, further comprising:
 a housing that substantially encloses at least one of the flexible cable, a portion of the frame, a portion of the connector, or a portion of the printed circuit board assembly;
 wherein the frame forms a portion of the housing.

6. A device, comprising:
 a frame configured to couple to at least one of a printed circuit board assembly or a housing;
 a flexible cable having a first end received by the frame, the first end of the flexible cable configured to operatively couple to the printed circuit board assembly; and
 a connector movably coupled to the frame via a membrane, a second end of the flexible cable being operatively coupled to the connector.

7. The device of claim 6, wherein the frame comprises a first portion and a second portion.

8. The device of claim 7, wherein the first portion of the frame is configured to receive the first end of the flexible cable, and the second portion of the frame is coupled to the connector via the membrane.

9. The device of claim 7, wherein the first portion of the frame and the second portion of the frame are angled relative to each other.

10. The device of claim 6, wherein the flexible cable comprises at least one of a braided contact, a stranded contact, or a flexible printed circuit board (PCB).

11. The device of claim 6, wherein the membrane substantially surrounds and extends between the frame and the connector.

12. The device of claim 6, wherein the membrane comprises at least one of silicone, rubber, or conductive fabric.

13. The device of claim 6, further comprising:
 a lock mechanism configured to positively retain the connector and an external connector.

14. The device of claim 13, wherein the lock mechanism comprises at least one of a locking clamp, a draw latch, a cam lock, a slam lock, a sash lock, a slide lock, a bayonet connection, or a threaded connection.

15. The device of claim 6, further comprising:
 the housing that substantially encloses at least one of the flexible cable, a portion of the frame, a portion of the connector, or a portion of the printed circuit board assembly;
 wherein the frame forms a portion of the housing.

16. The device of claim 6, further comprising:
 a plurality of connectors movably coupled to the frame via the membrane; and
 a plurality of flexible cables operatively coupled to respective connectors of the plurality of connectors.

17. A method, comprising:
 receiving, by a frame, a first end of a flexible cable, the first end of the flexible cable configured to couple to a printed circuit board assembly;
 operatively coupling a second end of the flexible cable to a connector; and
 movably coupling the connector to the frame via a membrane.

18. The method of claim 17, wherein the first end of the flexible cable is configured to couple to the printed circuit board assembly via at least one of soldering or press-fitting.

19. The method of claim 17, wherein operatively coupling the second end of the flexible cable to the connector further comprises:
 connecting the second end of the flexible cable to contact pins of the connector.

20. The method of claim 17, further comprising:
enclosing at least one of the flexible cable, a portion of the frame, a portion of the connector, or a portion of the printed circuit board assembly within a shielded housing.

* * * * *